US012249365B2

United States Patent
Lin (10) Patent No.: US 12,249,365 B2
(45) Date of Patent: Mar. 11, 2025

(54) MEMORY DEVICE CAPABLE OF PERFORMING IN-MEMORY COMPUTING

(71) Applicant: Winbond Electronics Corp., Taichung (TW)

(72) Inventor: Shu-Sen Lin, Hsinchu County (TW)

(73) Assignee: WINDBOND ELECTRONICS CORP., Taichung (TW)

( * ) Notice: Subject to any disclaimer, the term of this patent is extended or adjusted under 35 U.S.C. 154(b) by 144 days.

(21) Appl. No.: 18/178,958

(22) Filed: Mar. 6, 2023

(65) Prior Publication Data

US 2024/0304232 A1 Sep. 12, 2024

(51) Int. Cl.
  *G11C 11/408* (2006.01)
  *G11C 11/4091* (2006.01)
  *G11C 11/4096* (2006.01)
  *H03K 19/20* (2006.01)

(52) U.S. Cl.
  CPC ...... *G11C 11/4087* (2013.01); *G11C 11/4091* (2013.01); *G11C 11/4096* (2013.01); *H03K 19/20* (2013.01)

(58) Field of Classification Search
  CPC ............ G11C 11/4087; G11C 11/4091; G11C 11/4096; H03K 19/20
  USPC .................................................. 365/149, 205
  See application file for complete search history.

(56) References Cited

U.S. PATENT DOCUMENTS

| 5,732,019 A * | 3/1998 | Urai ................... G11C 16/3404 365/185.11 |
| 5,841,706 A * | 11/1998 | Umezaki ................. G11C 8/18 365/189.11 |
| 5,923,595 A * | 7/1999 | Kim ..................... G11C 7/1051 365/233.5 |
| 6,049,482 A * | 4/2000 | Aritome ................ G11C 16/10 365/185.24 |
| 7,417,907 B1 * | 8/2008 | Liu .......................... G11C 7/08 365/189.04 |
| 11,043,259 B2 | 6/2021 | Wentzlaff et al. |
| 11,061,646 B2 | 7/2021 | Sumbul et al. |
| 11,094,355 B1 * | 8/2021 | Simon ..................... G11C 7/065 |
| 2004/0001351 A1 * | 1/2004 | Subramanian .......... G11C 11/16 365/158 |

(Continued)

FOREIGN PATENT DOCUMENTS

TW    I505271 B    10/2015

*Primary Examiner* — Michael T Tran
(74) *Attorney, Agent, or Firm* — Birch, Stewart, Kolasch & Birch, LLP (57) ABSTRACT

A memory device capable of performing in-memory computing is provided and includes a memory cell array, a sense amplifier, a voltage control circuit, and a word line decoding circuit. The memory cell array includes memory cells arranged in a two-dimensional array. The memory cells on each row of the memory cell array are connected to a corresponding word line, and the memory cells on each column of the memory cell array are connected to a corresponding bit line. The sense amplifier detects a voltage level of the activated bit line and a voltage level of an inverse bit line corresponding to the bit line. The voltage control circuit selects a detection voltage provided to the sense amplifier according to a control signal from a memory controller. The word line decoding circuit activates a first word line and a second word line according to the control signal.

18 Claims, 6 Drawing Sheets

(56) References Cited

U.S. PATENT DOCUMENTS

| | | | |
|---|---|---|---|
| 2004/0004856 A1* | 1/2004 | Sakimura | G11C 11/15 365/158 |
| 2006/0291290 A1* | 12/2006 | Kim | G11C 16/3454 365/185.22 |
| 2007/0070764 A1* | 3/2007 | Miyamoto | G11C 11/22 365/222 |
| 2007/0297269 A1* | 12/2007 | Miyamoto | G11C 11/22 365/228 |
| 2008/0074930 A1* | 3/2008 | Kanda | G11C 17/14 365/185.17 |
| 2008/0112243 A1* | 5/2008 | Lin | G11C 7/1048 365/208 |
| 2010/0002493 A1* | 1/2010 | Miyakawa | G11C 29/24 365/210.1 |
| 2010/0124097 A1* | 5/2010 | Takase | G11C 13/0028 365/148 |
| 2010/0182863 A1* | 7/2010 | Fukiage | G11C 11/40618 365/230.03 |
| 2010/0188896 A1* | 7/2010 | Shinoda | G11C 29/50 365/185.18 |
| 2010/0246283 A1* | 9/2010 | Hirota | G11C 5/147 365/189.09 |
| 2011/0149666 A1* | 6/2011 | Chang | G11C 7/12 365/203 |
| 2012/0075912 A1* | 3/2012 | Hosono | G11C 13/0002 365/148 |
| 2012/0243319 A1* | 9/2012 | Kasai | G11C 16/10 365/185.18 |
| 2013/0201745 A1* | 8/2013 | Chung | G11C 17/08 365/96 |
| 2017/0017808 A1* | 1/2017 | Kwong | H04L 9/3278 |
| 2020/0105356 A1* | 4/2020 | Kulkarni | H04L 9/3278 |
| 2020/0381052 A1* | 12/2020 | Hioka | G11C 16/34 |
| 2021/0166769 A1* | 6/2021 | Liang | G11C 11/5642 |
| 2022/0277790 A1* | 9/2022 | Terada | G11C 13/0033 |
| 2022/0284953 A1* | 9/2022 | Takashima | G11C 13/0009 |
| 2022/0399400 A1* | 12/2022 | Takashima | H10B 63/34 |
| 2022/0406382 A1* | 12/2022 | Komatsu | G11C 16/3409 |

\* cited by examiner

MEMORY DEVICE CAPABLE OF PERFORMING IN-MEMORY COMPUTING

BACKGROUND OF THE INVENTION

Field of the Invention

The present invention relates to a memory device, and more particularly, to a memory device capable of performing in-memory computing.

Description of the Related Art

Traditional computer devices usually use a von Neumann architecture for data transmission between a central processing unit and a memory device. However, when demand for data transmission between the central processing unit and the memory device is extremely high, data transmission bottlenecks can occur between the central processing unit and the memory device. This is called a von Neumann bottleneck. Therefore, a memory device capable of performing in-memory operating is required to solve the above problem.

BRIEF SUMMARY OF THE INVENTION

An exemplary embodiment of the present invention provides a memory device capable of performing in-memory computing. The memory device comprises a memory cell array, a sense amplifier, a voltage control circuit, and a word line decoding circuit. The memory cell array comprises a plurality of memory cells arranged in a two-dimensional array. The memory cells on each row of the memory cell array are connected to a corresponding word line, and the memory cells on each column of the memory cell array are connected to a corresponding bit line. The sense amplifier detects a voltage level of the activated bit line and a voltage level of an inverse bit line corresponding to the bit line. The voltage control circuit selects a detection voltage provided to the sense amplifier according to a control signal from a memory controller. The word line decoding circuit activates a first word line and a second word line among the word lines according to the control signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated model of carrying out the invention. This description is made for the purpose of illustrating the general principles of the invention and should not be taken in a limiting sense. The scope of the invention is best determined by reference to the appended claims.

Figure 1:
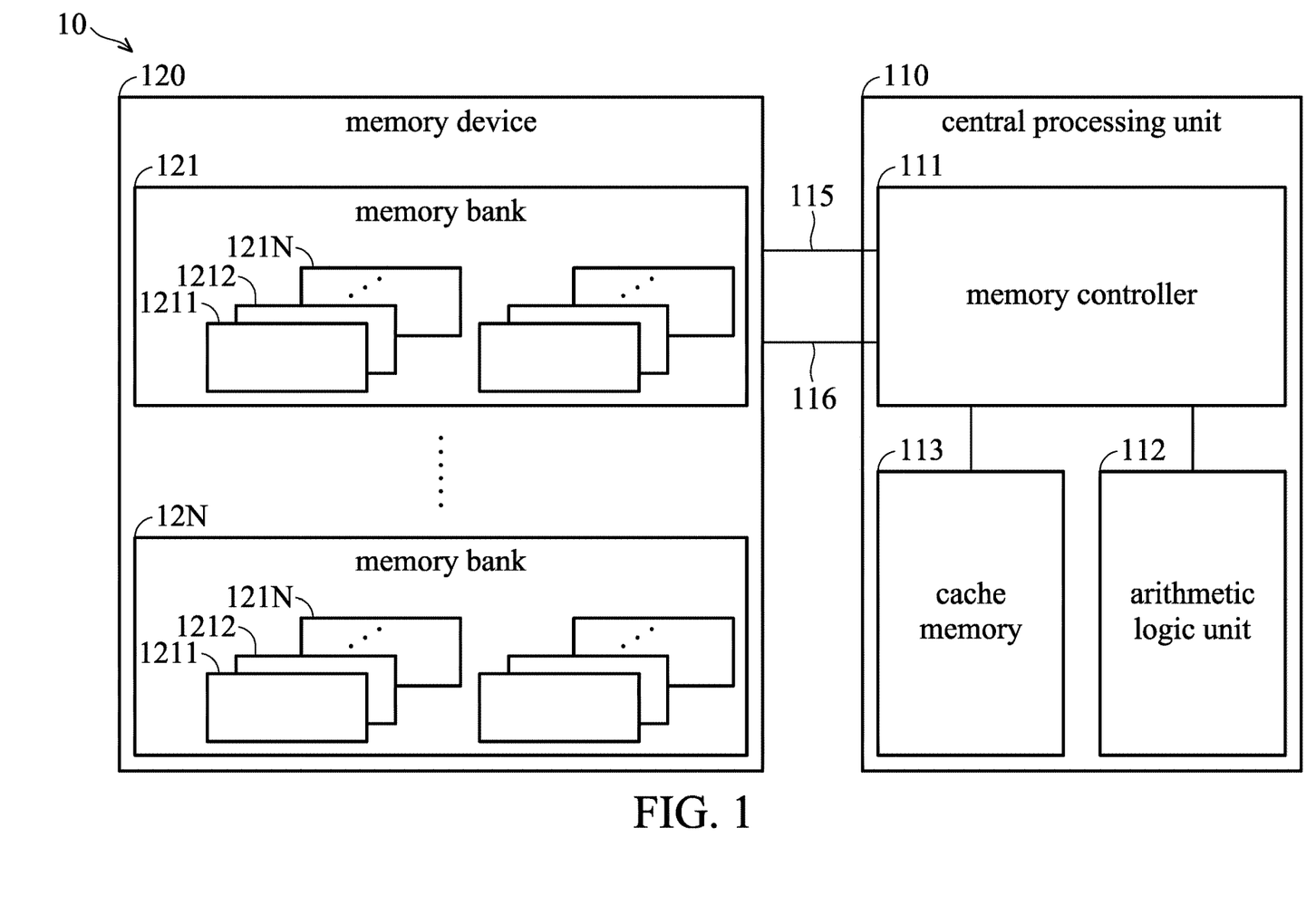
FIG. 1 is a schematic diagram showing a computing device according to an embodiment of the present invention.

FIG. 1 is a schematic diagram showing a computing device according to an embodiment of the present invention. As shown in FIG. 1, the computing device 10 comprises a central processing unit 110 and a memory device 120. The central processing unit 110 is electrically connected to the memory device 120. The memory device 120 is implemented by, for example, a dynamic random access memory (DRAM), but the invention is not limited thereto. The memory device 120 comprises, for example, a plurality of memory banks, and each memory bank comprises a plurality of memory cell arrays. Each memory cell array is implemented, for example, in a two-dimensional array (for example: M rows*N columns) arrangement. Each row of one memory cell array is connected to a corresponding word line, and each column thereof is connected to a bit line. In addition, each memory cell can store 1-bit or M-bit data, and M is an integer greater than 1.

The central processing unit 110 comprises, for example, a memory controller 111, an arithmetic logic unit (ALU) 112, and a cache memory 113. The memory controller 111 is used to control access to the data in the memory device 120. It should be noted that a control signal 115 that is transmitted from the memory controller 111 to the memory device 120 can control the memory device 120 to perform in-memory computing, such as performing a bitwise AND/OR operation. The memory controller 111 can further receive the data that has been processed by the bitwise operation from the memory device 120 or receive general data that is not processed by any logic operations.

The arithmetic logic unit 112 performs corresponding arithmetic operations and/or logical operations according to instructions executed by the central processing unit 110. In some embodiments, in order to reduce the requirement of data bandwidth between the central processing unit 110 and the memory device 120, the memory controller 111 of the central processing unit 110 will transmit a corresponding control signal 115 to the memory device 120 so that some of the logic operations (for example: the bitwise AND/OR operation) are executed by the memory device 120. Then, the central processing unit 110 receives the data that has been processed by the above logic operations from the memory device 120 (for example, through the data bus 116), and transmits the received data to the arithmetic logic unit 112 for subsequent processing.

The memory device 120 comprises, for example, a plurality of memory banks 121-12N, and each of the memory banks 121-121N comprises a plurality of memory cell arrays 1211-121N.

Figure 2A:
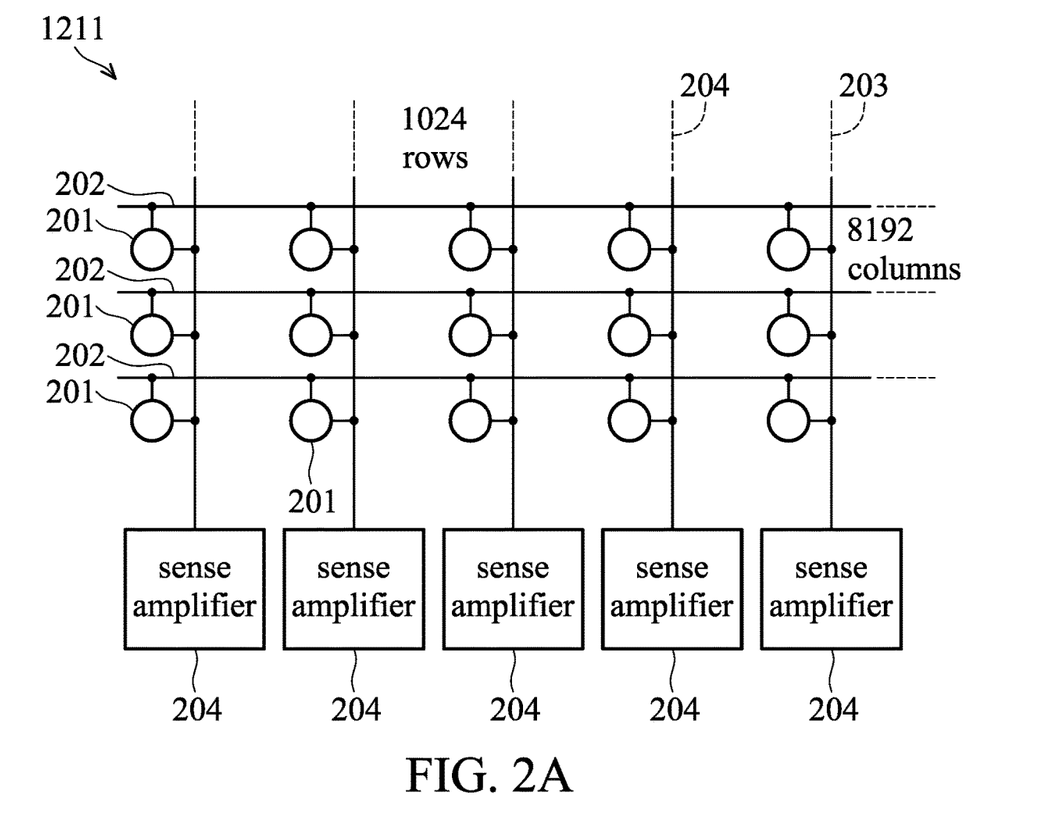
FIG. 2A is a circuit diagram of a memory cell array in the embodiment of FIG. 1 of the present invention.

FIG. 2A is a circuit diagram of a memory cell array according to the embodiment of FIG. 1 of the present invention. Please refer to FIG. 1 and FIG. 2A at the same time.

In FIG. 2A, the memory cell array 1211 is taken as an example for illustration. The circuit structures of the other memory cell arrays 1212-121N are similar to the circuit structure shown in FIG. 2A. The memory cell array 1211 comprises a plurality of memory cells 201, which are arranged in a two-dimensional array. The memory cells 201 on each row are connected to a corresponding word line 202, and the memory cells 201 on each column are connected to a corresponding bit line 203. In addition, each of the bit lines 203 is connected to a corresponding sense amplifier 204.

Figure 2B:
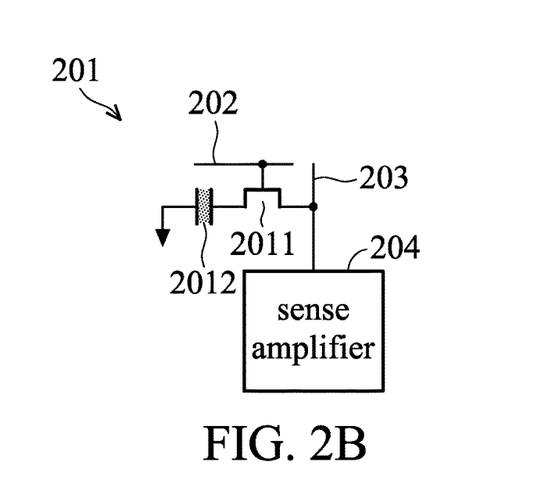
FIG. 2B is a circuit diagram of a memory cell in the embodiment of FIG. 2A according to the present invention.
Figure 2C:
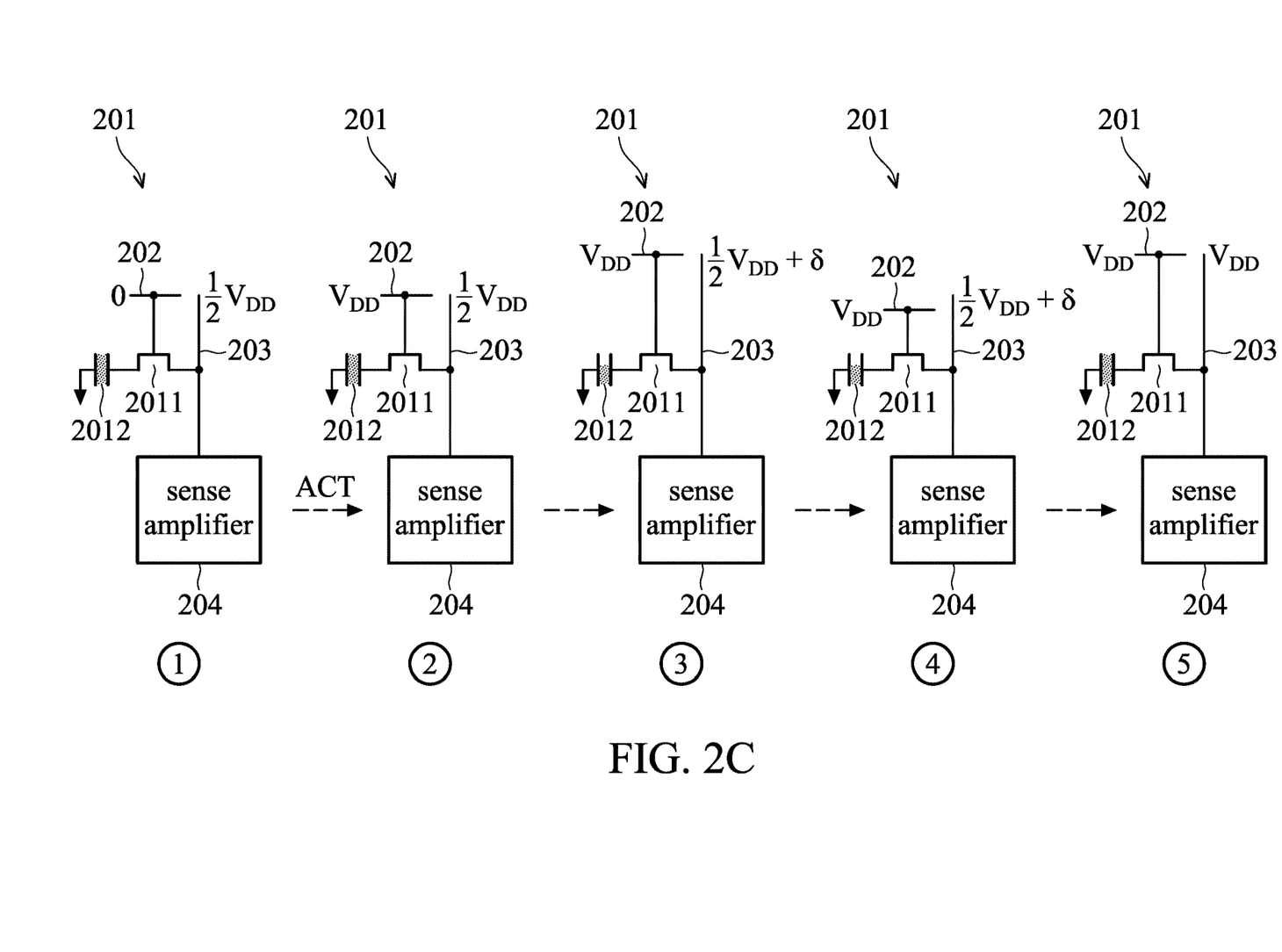
FIG. 2C is a schematic diagram showing a reading procedure of a memory cell of the embodiment of FIG. 2B of the present invention.

FIG. 2B is a circuit diagram of the memory cell according to the embodiment of FIG. 2A of the present invention. FIG. 2C is a schematic diagram of a reading procedure of the memory cell in the embodiment of FIG. 2B of the present invention.

Please refer to FIG. 2B, the memory cell 201 comprises a transistor 2011 and a capacitor 2012. The logic level of the word line 202 controls the transistor 2011 to be turned on and off. In addition, FIG. 2C shows schematic diagrams of States S1-S5 in which the memory cell 201 performs an access program.

In FIG. 2C, the capacitor 2012 of the memory cell 201 is fully charged. State S1 represents the initial pre-charge state. At this time, the logic level of the word line 202 is "0", the sense amplifier 204 is turned off, and the voltage level of the bit line 203 is pre-charged to a voltage of $\frac{1}{2}V_{DD}$. Next, the access operation for the memory cell 201 is triggered by the ACT command on the word line 202 corresponding to the memory cell 201, and the reading procedure enters State S2. In State S2, the word line 202 is activated so that the voltage level of the word line 202 reaches the voltage of $\frac{1}{2}V_{DD}$. At this time, the sense amplifier 204 is still turned off. State S3 represents a charge-sharing state in which the charge stored in the capacitor 2012 flow to the bit line 203 from the memory cell 201 so that the voltage level of the bit line 203 increases to the voltage of $\frac{1}{2}V_{DD}+\delta$. At this time, the sense amplifier 204 is still turned off. In State S4, the sense amplifier 204 is turned on to sense the deviation value $\delta$ (which can be a positive deviation value or a negative deviation value) between the voltage level of the bit line 203 and the voltage of $\frac{1}{2}V_{DD}$ and amplifies the deviation value $\delta$ until the voltage level of the bit line 203 reaches the voltage of $\frac{1}{2}V_{DD}$, which means that the reading procedure enters State S5. At this time, since the capacitor 2012 is still connected to the bit line 203, the potential stored in the capacitor 2012 will be charged to the original fully charged state.

Figure 3:
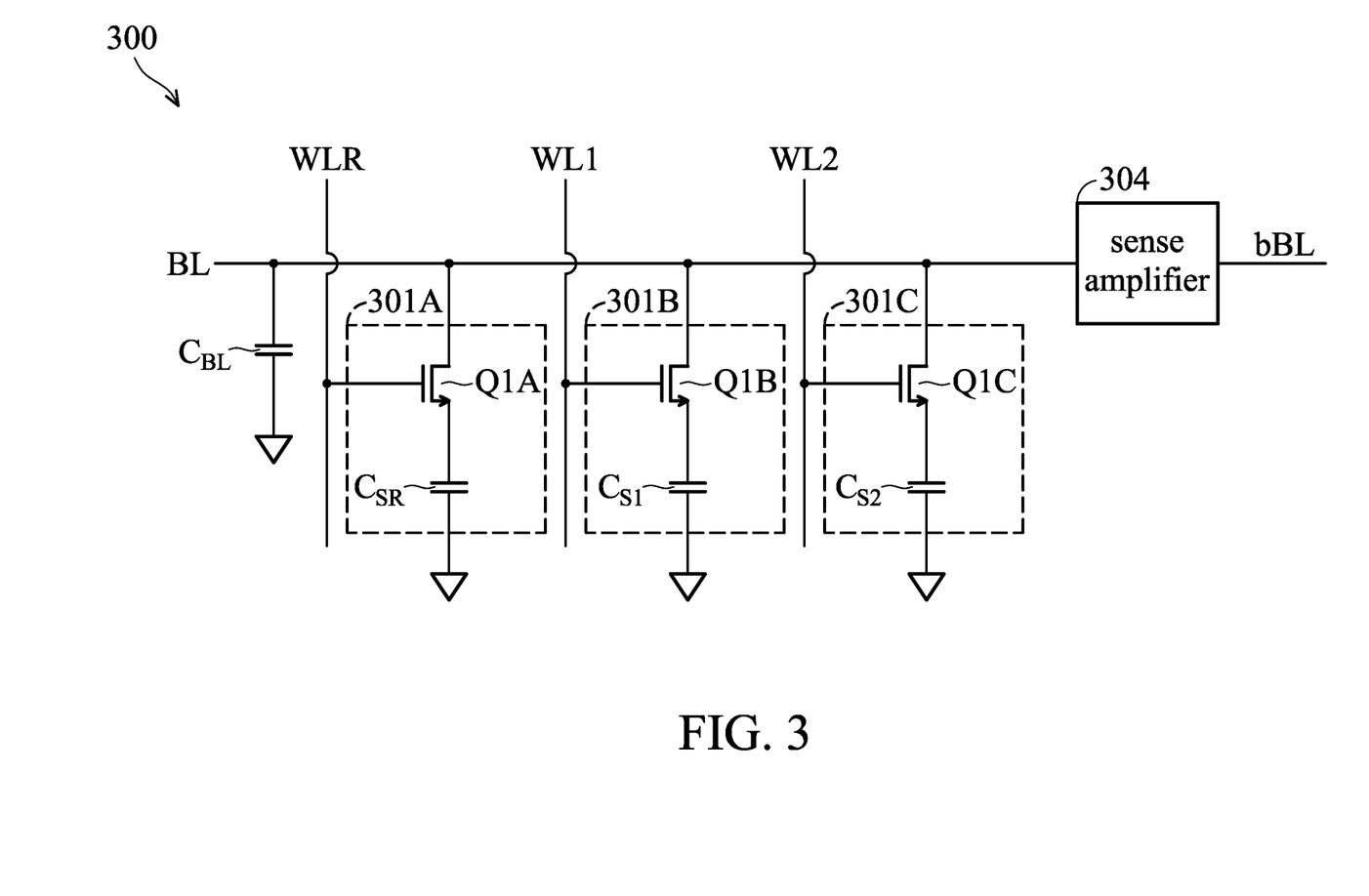
FIG. 3 is a schematic diagram showing a memory cell array according to an embodiment of the present invention.

FIG. 3 is a schematic diagram of a memory cell array according to an embodiment of the present invention. Please refer to FIG. 1 and FIG. 3 at the same time.

The memory cell array 1211 comprises memory cells 301A, 301B and 301C. The memory cells 301A-301C are connected to the same bit line BL. The sense amplifier 304 is used to sense the voltage level of the bit line BL and the voltage level of the reverse bit line bBL. In addition, the corresponding word lines WLR, WL1 and WL2 of the memory cells 301A-301C are activated simultaneously so that the memory cells 301A-301C are connected to the bit-line BL. Therefore, charge-sharing is performed according to the charges stored in the capacitors $C_{SR}$, $C_{S1}$, and $C_{S2}$ in the memory cells 301A-301C. The deviation value $\delta$ of the voltage level of the bit line BL after the charge-sharing will be towards the majority value of the voltage levels stored in capacitors $C_{SR}$, $C_{S1}$, and $C_{S2}$ of the three memory cells 301A-301C.

For example, if at least two of the capacitors $C_{SR}$, $C_{S1}$, and $C_{S2}$ of the memory cells 301A-301C are initially in the charged state, the voltage level of the bit line BL will have a positive deviation. On the contrary, if at most one of the capacitors $C_{SR}$, $C_{S1}$, and $C_{S2}$ of the memory cells 301A-301C is initially in the charged state, the voltage level of the bit line BL will have a negative deviation.

In details, the memory cell 301A can be regarded as a reference memory cell, and the voltage level R stored by the capacitor $C_{SR}$ can be used to control the memory cell array 1211 to perform a bitwise AND operation or a bitwise OR operation. For the convenience of description, the voltage levels stored in the capacitors $C_{S1}$ and $C_{S2}$ are A and B, respectively, and the voltage levels R, A, and B can be regarded as the logic states of the memory cells 301A, 301B, and 301C, respectively. Therefore, after the word lines WLR, WL1, and WL2 are activated simultaneously, the logic state OUT detected by the sense amplifier 304 can be represented by Formula (1) or Formula (2):

$$OUT = RA + RB + AB \qquad (1)$$

$$= R(A+B) + \overline{R}(AB) \qquad (2)$$

$$OUT = RA + RB + AB \qquad (1)$$

$$= R(A+B) + \overline{R}(AB) \qquad (2)$$

Therefore, if the initial logic state of the voltage level R is "1", the logic state OUT of the bit line BL after the charge-sharing is determined by the bitwise OR operation performed on the voltage levels A and B. If the initial logic state of the voltage level R is "0", the logic state OUT of the bit line BL after the charge-sharing is determined by the bitwise AND operation performed on the voltage levels A and B. Therefore, the truth tables of the bitwise AND operation and the bitwise OR operation performed by the memory cells 301A-301C can be represented by Table 1 and Table 2 respectively:

TABLE 1 bitwise AND operation (R = 0)

| A | B | OUT |
|---|---|-----|
| 0 | 0 | 0 |
| 0 | 1 | 0 |
| 1 | 0 | 0 |
| 1 | 1 | 1 |

TABLE 2 bitwise OR operation (R = 1)

| A | B | OUT |
|---|---|-----|
| 0 | 0 | 0 |
| 0 | 1 | 1 |
| 1 | 0 | 1 |
| 1 | 1 | 1 |

The deviation value $\Delta V_{BL}$ between the voltage level of the bit line BL and the voltage level of the reverse bit line bBL detected by the sense amplifier 304 in FIG. 3 can be expressed by Formula (3):

$$\Delta V_{BL} = \frac{mC_S \times V_{BLH} + C_{BL} \times V_{BLEQ}}{nC_S + C_{BL}} - V_{BLEQ} \qquad (3)$$

$$= \frac{mC_S \times V_{BLH} - nC_S \times V_{BLEQ}}{nC_S + C_{BL}}$$

$$= \frac{m \times V_{BLH} - n \times V_{BLEQ}}{n + C_{BL}/C_S}$$

-continued $$\Delta V_{BL} = \frac{mC_S \times V_{BLH} + C_{BL} \times V_{BLEQ}}{nC_S + C_{BL}} - V_{BLEQ} \quad (3)$$

$$= \frac{mC_S \times V_{BLH} - nC_S \times V_{BLEQ}}{nC_S + C_{BL}}$$

$$= \frac{m \times V_{BLH} - n \times V_{BLEQ}}{n + C_{BL}/C_S}$$

$$\Delta V_{BL} = \frac{mC_S \times V_{BLH} + C_{BL} \times V_{BLEQ}}{nC_S + C_{BL}} - V_{BLEQ} \quad (3)$$

$$= \frac{mC_S \times V_{BLH} - nC_S \times V_{BLEQ}}{nC_S + C_{BL}}$$

$$= \frac{m \times V_{BLH} - n \times V_{BLEQ}}{n + C_{BL}/C_S}$$

m represents the number of memory cells whose stored voltage levels are the level of $V_{BLH}$ (which represents a high logic state) before the charge-sharing. n represents the number of activated word lines on the same bit line, and n is an integer, for example, between 0 and 3. If three word lines are activated simultaneously, then n=3. If two word lines are activated simultaneously, then n=2. In some embodiments, the voltage $V_{BLEQ}$ is equal to $$\frac{1}{2} V_{DD} \left( V_{BLEQ} = \frac{1}{2} V_{DD} \right).$$

In one embodiment, it is assumed that the voltage $V_{DD}$ is equal to 1V ($V_{DD}$=1V), the voltage $V_{BLH}$ is equal to 1V ($V_{BLH}$=1V), the values of the capacitor $C_{S1}$ and $C_{S2}$ are equal to 17 fF ($C_{S1}$=$C_{S2}$=17 fF), the value of the capacitor $C_{BL}$ is equal to 27 fF ($C_{BL}$=27 fF), and the ratio of the values of the capacitors $C_{BL}$ and $C_{S1}$ is equal to $$1.6 \left( \frac{C_{BL}}{C_{S1}} \cong 1.6 \right).$$

Table 1, Table 2, and Formula (3) can be used to derive the deviation value $\Delta V_{BL}$ and the logic state OUT of the corresponding bit line BL that are detected by the sense amplifier 204 when the three word lines WLR, WL1 and WL2 are activated (i.e. n=3) simultaneously, for example, shown in Table 3 and Table 4 respectively:

TABLE 3 bitwise AND operation (R = 0)
when three word lines are activated (n = 3)

| A | B | m | $\Delta V_{BL}$ | OUT |
|---|---|---|---|---|
| 0 | 0 | 0 | −0.315 V | 0 |
| 0 | 1 | 1 | −0.104 V | 0 |
| 1 | 0 | 1 | −0.104 V | 0 |
| 1 | 1 | 2 | +0.104 V | 1 |

TABLE 4 bitwise OR operation (R = 1)
when three word lines are activated (n = 3)

| A | B | m | $\Delta V_{BL}$ | OUT |
|---|---|---|---|---|
| 0 | 0 | 0 | −0.104 V | 0 |

TABLE 4-continued bitwise OR operation (R = 1)
when three word lines are activated (n = 3)

| A | B | m | $\Delta V_{BL}$ | OUT |
|---|---|---|---|---|
| 0 | 1 | 1 | +0.104 V | 1 |
| 1 | 0 | 1 | +0.104 V | 1 |
| 1 | 1 | 2 | +0.315 V | 1 |

Figure 4A:
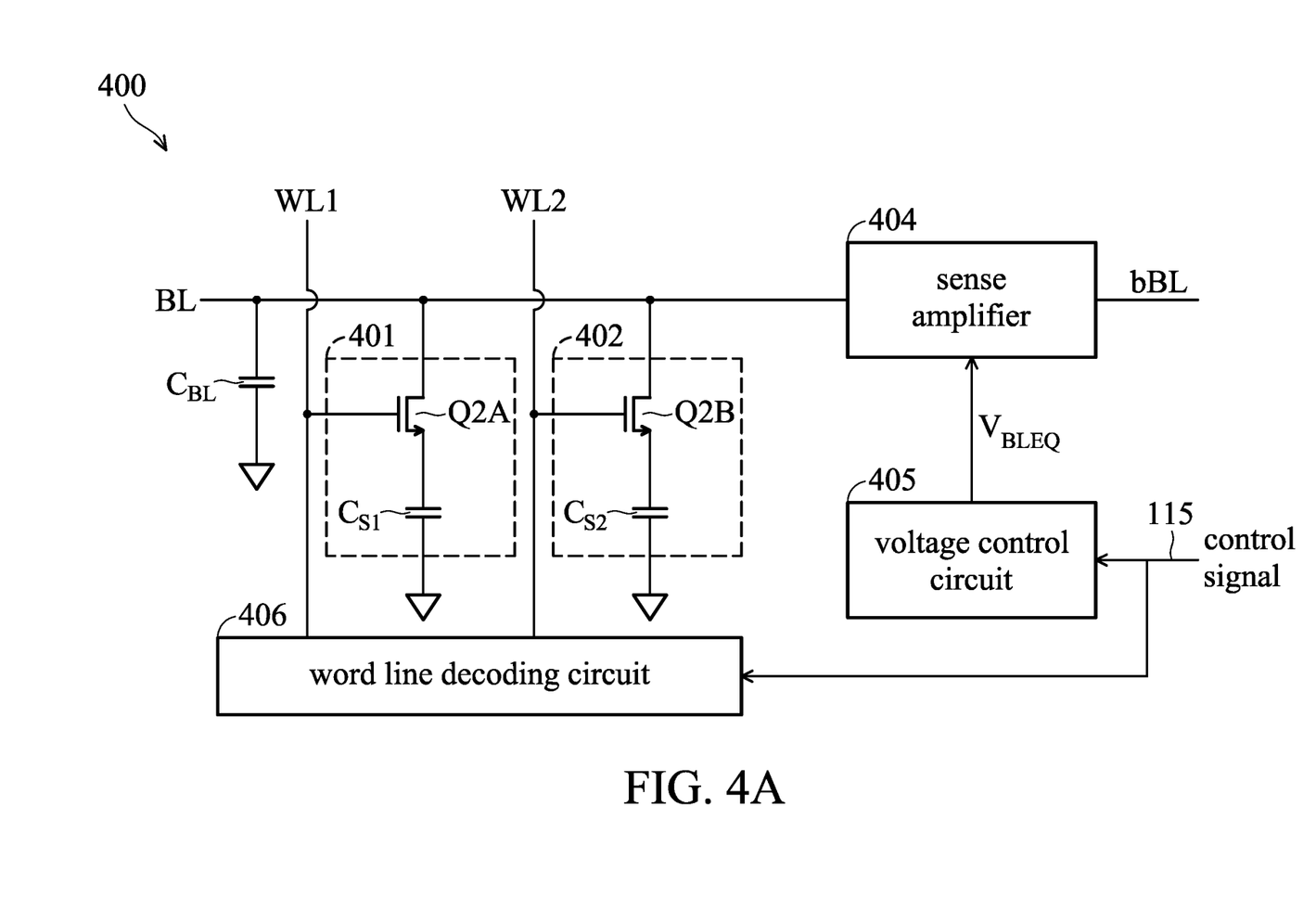
FIG. 4A is a schematic diagram of a memory cell array according to another embodiment of the present invention.
Figure 4B:
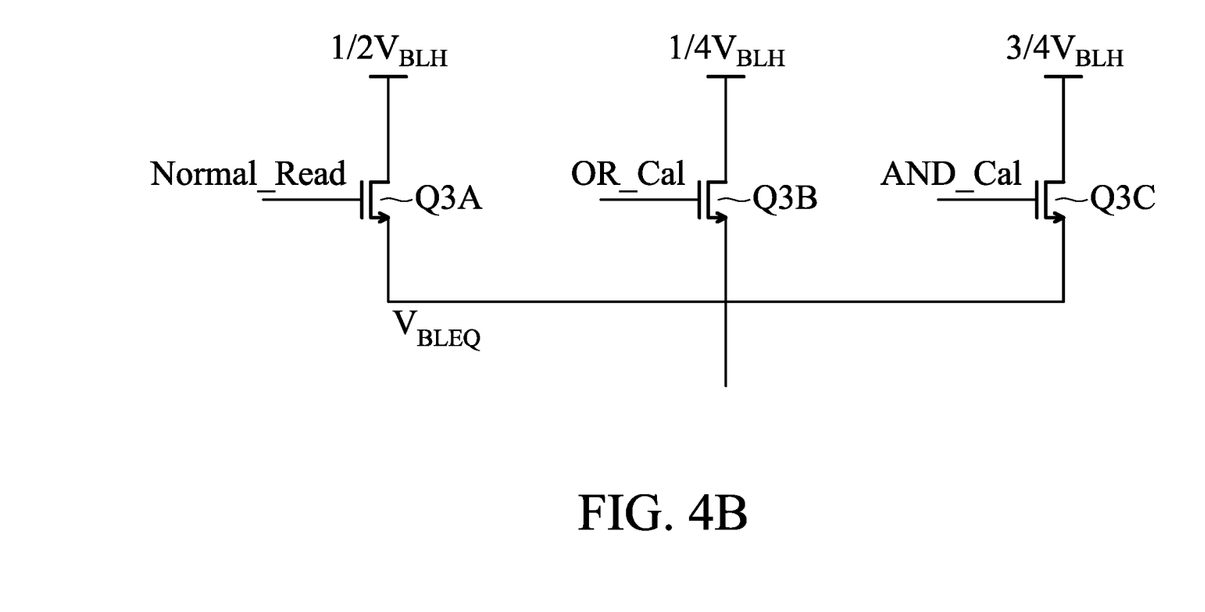
FIG. 4B is a circuit diagram of a voltage control circuit in the embodiment of FIG. 4A according to the present invention.

FIG. 4A is a schematic diagram of a memory cell array according to another embodiment of the present invention. FIG. 4B is a circuit diagram of the voltage control circuit in the embodiment of FIG. 4A according to the present invention. Please refer to FIG. 1 and FIGS. 4A-4B at the same time.

A memory cell array 400 comprises memory cells 401 and 402, a sense amplifier 404, a voltage control circuit 405, and a word line decoding circuit 406. The memory cells 401 and 402 are connected to the same bit line BL, and the sense amplifier 404 is used to sense the voltage level of bit line BL and the voltage level of the reverse bit line bBL. In addition, the corresponding word lines WL1 and WL2 of the memory cells 401 and 402 can be activated simultaneously so that the memory cells 401 and 402 are connected to the bit line BL. In the embodiment, the memory cell array 400 can perform charge-sharing on the data stored in the memory cells 401 and 402 through, for example, the voltage control circuit 405 and the word line decoding circuit 406 to achieve a bitwise AND operation or a bitwise OR operation.

The voltage control circuit 405 can select the detection voltage $V_{BLEQ}$ provided to the sense amplifier 404 according to, for example, the control signal 115 from the memory controller 111. In some embodiments, the voltage control circuit 405 selects one of the voltages of $$\frac{1}{4} V_{BLH}, \frac{1}{2} V_{BLH}, \text{ and } \frac{3}{4} V_{BLH}$$

to serve as the voltage level of the detection voltage $V_{BLEQ}$, but the invention is not limited thereto. For example, the control signal 115 may comprise related control signals for memory operations and an address signal for activating a related word line of the memory cell array 400. The related control signals for the above memory operations comprise a normal read control signal Normal_Read, or the related control signals for the above memory operations comprise an operation control signal OR_Cal and an operation control signal AND_Cal. At most one of the above three control signals is in a high logic state to enable the memory cell array 400 to execute a corresponding operation.

For example, when the normal read control signal Normal_Read is in the high logic state, the memory cell array 400 performs a normal read operation, which means that the word line decoding circuit 406 activates one of the word lines according to the related address signal in the control signal 115 for the access to the data in the memory cells on the word line. At this time, the transistor Q3A in FIG. 4B is turned on to cause the voltage of ½$V_{BLH}$ to serve as the detection voltage $V_{BLEQ}$.

When the OR operation control signal OR_Cal is in the high logic state, the memory cell array 400 performs a bitwise OR operation. At this time, the address signal in the control signal 115 is also changed to simultaneously enable two word lines (for example, the word lines WL1 and WL2) so that the bitwise OR operation is formed on the data stored in the corresponding memory cells (for example, the memory cells 401 and 402). In addition, the transistor Q3B in FIG. 4B is turned on to cause the voltage of $\frac{1}{4}V_{BLH}$ to serve as the detection voltage $V_{BLEQ}$.

When the AND operation control signal AND_Cal is in the high logic state, the memory cell array 400 performs a bitwise AND operation. At this time, the address signal in the control signal 115 is also changed to simultaneously enable two word lines (for example, the word lines WL1 and WL2) so that the bitwise AND operation is performed on the data stored in the corresponding memory cells (for example, memory cells 401 and 402). In addition, the transistor Q3C in FIG. 4B is turned on to cause the voltage of $\frac{3}{4}V_{BLH}$ to serve as the detection voltage $V_{BLEQ}$.

No matter which one of the bitwise OR operation or the bitwise AND operation is performed by the memory cell array 400, the charge-sharing mechanism of the memory cells 401 and 402 on the bit line BL may refer to Formula (3). However, in the embodiment, the word lines WL1 and WL2 are activated simultaneously, and, thus, the value of n is equal to 2.

In the embodiment shown in FIGS. 4A-4B, it is assumed that the voltage levels A and B can be regarded as the logic states of the memory cells 401 and 402 respectively. According to the similar data in the embodiment shown in FIG. 3, the voltage $V_{DD}$ is equal to 1V ($V_{DD}$=1V), the voltage $V_{BLH}$ is equal to 1V ($V_{BLH}$=1V), the values of the capacitor $C_{S1}$ and $C_{S2}$ are equal to 17 fF ($C_{S1}$=$C_{S2}$=17 fF), the value of the capacitor $C_{BL}$ is equal to ($C_{BL}$=27 fF), and the ratio of the values of the capacitors $C_{BL}$ and $C_{S1}$ is equal to $$1.6 \ \left(\frac{C_{BL}}{C_{S1}} \cong 1.6\right).$$

Therefore, the deviation value $\Delta V_{BL}$ and the logic state OUT of the corresponding bit line BL that are detected by the sense amplifier 204 can be derived when the two word lines WL1 and WL2 are activated (i.e. n=2) simultaneously, for example, shown in Table 5 and Table 6:

TABLE 5 bitwise AND operation (AND_Cal = 1)
when two word lines are activated (n = 2)

| A | B | m | $V_{BLEQ}$ | $\Delta V_{BL}$ | OUT |
|---|---|---|---|---|---|
| 0 | 0 | 0 | $\frac{3}{4} V_{BLH}$ | −0.417 V | 0 |
| 0 | 1 | 1 | $\frac{3}{4} V_{BLH}$ | −0.139 V | 0 |
| 1 | 0 | 1 | $\frac{3}{4} V_{BLH}$ | −0.139 V | 0 |
| 1 | 1 | 2 | $\frac{3}{4} V_{BLH}$ | +0.139 V | 1 |

TABLE 6 bitwise OR operation (OR_Cal = 1)
when two word lines are activated (n = 2)

| A | B | m | $V_{BLEQ}$ | $\Delta V_{BL}$ | OUT |
|---|---|---|---|---|---|
| 0 | 0 | 0 | $\frac{1}{4} V_{BLH}$ | −0.139 V | 0 |

TABLE 6-continued bitwise OR operation (OR_Cal = 1)
when two word lines are activated (n = 2)

| A | B | m | $V_{BLEQ}$ | $\Delta V_{BL}$ | OUT |
|---|---|---|---|---|---|
| 0 | 1 | 1 | $\frac{1}{4} V_{BLH}$ | +0.139 V | 1 |
| 1 | 0 | 1 | $\frac{1}{4} V_{BLH}$ | +0.139 V | 1 |
| 1 | 1 | 2 | $\frac{1}{4} V_{BLH}$ | +0.417 V | 1 |

According to the embodiments in FIG. 3 and FIGS. 4A-4B, it can be deduced that the influence of simultaneously activating three word lines and simultaneously activating two word lines on the deviation value $\Delta V_{BL}$ is shown in Table 7:

TABLE 7

| bitwise operation | A | B | $\Delta V_{BL\_3WL}$ | $\Delta V_{BL\_2WL}$ | $|\Delta V_{BL\_2WL}| - |\Delta V_{BL\_3WL}|$ |
|---|---|---|---|---|---|
| AND | 0 | 0 | −0.315 V | −0.417 V | 102 mV |
|  | 0 | 1 | −0.104 V | −0.139 V | 35 mV |
|  | 1 | 0 | −0.104 V | −0.139 V | 35 mV |
|  | 1 | 1 | +0.104 V | +0.139 V | 35 mV |
| OR | 0 | 0 | −0.104 V | −0.139 V | 35 mV |
|  | 0 | 1 | +0.104 V | +0.139 V | 35 mV |
|  | 1 | 0 | +0.104 V | +0.139 V | 35 mV |
|  | 1 | 1 | +0.315 V | +0.417 V | 102 mV |

$\Delta V_{BL\_2WL}$ represents the deviation value $\Delta V_{BL}$ in FIGS. 4A-4B, and $\Delta V_{BL\_3WL}$ represents the deviation value $\Delta V_{BL}$ in FIG. 3. Therefore, it can be seen from Table 7 that in the cases where the memory cell array 400 performs the bitwise AND operation, when the voltage levels (A,B) are (0,0), (0,1), (1,0), and (1,1) respectively, the signal margin of the deviation value $\Delta V_{BL\_2WL}$ is larger than the signal margin of the deviation value $\Delta V_{BL\_3WL}$. In addition, in the cases where the memory cell array 400 performs the bitwise OR operation, when the voltage levels (A,B) are (0,0), (0,1), (1,0), and (1, 1) respectively, the signal margin of the deviation value $\Delta V_{BL\_2WL}$ is also greater than the signal margin of the deviation value $\Delta V_{BL\_3WL}$. In other words, compared with the memory cell array 300 in FIG. 3, the memory cell array 400 in FIG. 4A has a greater signal margin. Therefore, the sense amplifier 404 can determine the logic level of the bit line BL more easily and accurately, and there is a greater tolerance for semiconductor process variations.

According to the above embodiments, the present invention provides a memory device capable of performing in-memory computing that comprises a memory cell array. The memory device may activate several word lines simultaneously through a word line decoding circuit to perform charge-sharing on the corresponding memory cells. The memory device may further select an appropriate detection voltage through a voltage control circuit to perform a bitwise AND operation or a bitwise OR operation. Therefore, the memory cell array of the present invention may have a greater signal margin, and there is a greater tolerance to semiconductor process variations.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device capable of performing in-memory computing, comprising:
   a memory cell array comprising a plurality of memory cells arranged in a two-dimensional array, wherein the memory cells on each row of the memory cell array are connected to a corresponding word line, and the memory cells on each column of the memory cell array are connected to a corresponding bit line;
   a sense amplifier detecting a voltage level of the activated bit line and a voltage level of an inverse bit line corresponding to the bit line;
   a voltage control circuit selecting a detection voltage provided to the sense amplifier according to a control signal from a memory controller; and
   a word line decoding circuit activating a first word line and a second word line among the word lines according to the control signal,
   wherein:
   the control signal comprises a normal read control signal, an OR operation control signal, and an AND operation control signal, and
   the normal read control signal, the OR operation control signal, or the AND operation control signal is in a high logic state.

2. The memory device capable of performing in-memory computing as claimed in claim 1, wherein the voltage control circuit selects a first voltage, a second voltage, or a third voltage to serve as the detection voltage provided to the sense amplifier according to the control signal from the memory controller.

3. The memory device capable of performing in-memory computing as claimed in claim 1, wherein the memory cell array comprises a first memory cell and a second memory cell respectively connected to the first word line and the second word line, and the first memory cell and the second memory cell are simultaneously connected to the bit line.

4. The memory device capable of performing in-memory computing as claimed in claim 3, wherein:
   a first capacitor of the first memory cell and a second capacitor of the second memory cell respectively store a first data voltage and a second data voltage in an initial state,
   in response to the OR operation control signal or the AND operation control signal being in the high logic state, the word line decoding circuit simultaneously activates the first word line and the second word line according to an address signal in the control signal, charge-sharing is performed on the first capacitor of the first memory cell and the second capacitor of the second memory cell to change a pre-charge voltage of the bit line to a result voltage, and the result voltage is equal to a sum of the pre-charge voltage and a deviation value.

5. The memory device capable of performing in-memory computing as claimed in claim 4, wherein:
   in response to the OR operation control signal being in the high logic state, the voltage control circuit selects the second voltage to serve as the detection voltage provided to the sense amplifier, and
   the voltage level of the bit line detected by the sense amplifier is obtained by performing a bitwise OR operation on the first data voltage and the second data voltage.

6. The memory device capable of performing in-memory computing as claimed in claim 5, wherein:
   in response to the first data voltage and the second data voltage being in a low logic state, the voltage level of the bit line detected by the sense amplifier is in the low logic state, and
   in response to at least one of the first data voltage and the second data voltage being in the high logic state, the voltage level of the bit line detected by the sense amplifier is in the high logic state.

7. The memory device capable of performing in-memory computing as claimed in claim 4, wherein:
   in response to the AND operation control signal being in the high logic state, the voltage control circuit selects the third voltage to serve as the detection voltage provided to the sense amplifier, and
   the voltage level of the bit line detected by the sense amplifier is obtained by performing a bitwise AND operation on the first data voltage and the second data voltage.

8. The memory device capable of performing in-memory computing as claimed in claim 7, wherein:
   in response to at least one of the first data voltage and the second data voltage being in a low logic state, the voltage level of the bit line detected by the sense amplifier is in the low logic state, and
   in response to both the first data voltage and the second data voltage being in the high logic state, the voltage level of the bit line detected by the sense amplifier is in the high logic state.

9. A memory device capable of performing in-memory computing, comprising:
   a memory cell array comprising a plurality of memory cells arranged in a two-dimensional array, wherein the memory cells on each row of the memory cell array are connected to a corresponding word line, and the memory cells on each column of the memory cell array are connected to a corresponding bit line;
   a sense amplifier detecting a voltage level of the activated bit line and a voltage level of an inverse bit line corresponding to the bit line;
   a voltage control circuit selecting a detection voltage provided to the sense amplifier according to a control signal from a memory controller; and
   a word line decoding circuit activating a first word line and a second word line among the word lines according to the control signal;
   wherein the voltage control circuit selects a first voltage, a second voltage, or a third voltage to serve as the detection voltage provided to the sense amplifier according to the control signal from the memory controller;
   wherein the third voltage is greater than the first voltage, and the first voltage is greater than the second voltage.

10. The memory device capable of performing in-memory computing as claimed in claim 9, wherein:
    the control signal comprises a normal read control signal, an OR operation control signal, and an AND operation control signal, and
    the normal read control signal, the OR operation control signal, or the AND operation control signal is in a high logic state.

11. The memory device capable of performing in-memory computing as claimed in claim 10, wherein the memory cell array comprises a first memory cell and a second memory cell respectively connected to the first word line and the second word line, and the first memory cell and the second memory cell are simultaneously connected to the bit line.

12. The memory device capable of performing in-memory computing as claimed in claim 11, wherein:
   a first capacitor of the first memory cell and a second capacitor of the second memory cell respectively store a first data voltage and a second data voltage in an initial state,
   in response to the OR operation control signal or the AND operation control signal being in the high logic state, the word line decoding circuit simultaneously activates the first word line and the second word line according to an address signal in the control signal, charge-sharing is performed on the first capacitor of the first memory cell and the second capacitor of the second memory cell to change a pre-charge voltage of the bit line to a result voltage, and the result voltage is equal to a sum of the pre-charge voltage and a deviation value.

13. The memory device capable of performing in-memory computing as claimed in claim 12, wherein:
   in response to the first data voltage and the second data voltage being in a low logic state, the voltage level of the bit line detected by the sense amplifier is in the low logic state, and
   in response to at least one of the first data voltage and the second data voltage being in the high logic state, the voltage level of the bit line detected by the sense amplifier is in the high logic state.

14. A memory device capable of performing in-memory computing, comprising:
   a memory cell array comprising a plurality of memory cells arranged in a two-dimensional array, wherein the memory cells on each row of the memory cell array are connected to a corresponding word line, and the memory cells on each column of the memory cell array are connected to a corresponding bit line;
   a sense amplifier detecting a voltage level of the activated bit line and a voltage level of an inverse bit line corresponding to the bit line;
   a voltage control circuit selecting a detection voltage provided to the sense amplifier according to a control signal from a memory controller; and
   a word line decoding circuit activating a first word line and a second word line among the word lines according to the control signal;
   wherein the voltage control circuit selects a first voltage, a second voltage, or a third voltage to serve as the detection voltage provided to the sense amplifier according to the control signal from the memory controller;
   wherein:
   a high logic state of the bit line has a first voltage level, and
   the first voltage is ½ of the first voltage level, the second voltage is ¼ of the first voltage level, and the third voltage is ¾ of the first voltage level.

15. The memory device capable of performing in-memory computing as claimed in claim 14, wherein:
   the control signal comprises a normal read control signal, an OR operation control signal, and an AND operation control signal, and
   the normal read control signal, the OR operation control signal, or the AND operation control signal is in a high logic state.

16. The memory device capable of performing in-memory computing as claimed in claim 15, wherein the memory cell array comprises a first memory cell and a second memory cell respectively connected to the first word line and the second word line, and the first memory cell and the second memory cell are simultaneously connected to the bit line.

17. The memory device capable of performing in-memory computing as claimed in claim 16, wherein:
   a first capacitor of the first memory cell and a second capacitor of the second memory cell respectively store a first data voltage and a second data voltage in an initial state,
   in response to the OR operation control signal or the AND operation control signal being in the high logic state, the word line decoding circuit simultaneously activates the first word line and the second word line according to an address signal in the control signal, charge-sharing is performed on the first capacitor of the first memory cell and the second capacitor of the second memory cell to change a pre-charge voltage of the bit line to a result voltage, and the result voltage is equal to a sum of the pre-charge voltage and a deviation value.

18. The memory device capable of performing in-memory computing as claimed in claim 17, wherein:
   in response to the first data voltage and the second data voltage being in a low logic state, the voltage level of the bit line detected by the sense amplifier is in the low logic state, and
   in response to at least one of the first data voltage and the second data voltage being in the high logic state, the voltage level of the bit line detected by the sense amplifier is in the high logic state.

* * * * *